United States Patent
Sun et al.

(10) Patent No.: US 10,233,529 B2
(45) Date of Patent: Mar. 19, 2019

(54) MASK ASSEMBLY, AND APPARATUS AND METHOD FOR DETECTING FILM THICKNESS OF EVAPORATION MATERIAL ON THE MASK

(71) Applicant: BOE TECHNOLOGY GROUP CO., LTD., Beijing (CN)

(72) Inventors: Zhongyuan Sun, Beijing (CN); Jinxiang Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/909,055

(22) Filed: Mar. 1, 2018

(65) Prior Publication Data

US 2018/0291495 A1    Oct. 11, 2018

(30) Foreign Application Priority Data

Apr. 11, 2017    (CN) .......................... 2017 1 0232406

(51) Int. Cl.
*C23C 14/04* (2006.01)
*C23C 14/24* (2006.01)
*G01B 11/06* (2006.01)

(52) U.S. Cl.
CPC ............ *C23C 14/042* (2013.01); *C23C 14/24* (2013.01); *G01B 11/06* (2013.01)

(58) Field of Classification Search
CPC ..... C23C 14/042; C23C 14/24; C23C 14/547; G01B 11/06
USPC ................................................ 356/325–640
See application file for complete search history.

(56) References Cited

U.S. PATENT DOCUMENTS 9,733,561 B2    8/2017   Kim
2018/0080756 A1  3/2018   Zhang et al.

FOREIGN PATENT DOCUMENTS

| CN | 102478389 A | 5/2012 |
| CN | 104128342 A | 11/2014 |
| CN | 104359412 A | 2/2015 |
| CN | 204265826 U | 4/2015 |
| CN | 105154823 A | 12/2015 |
| CN | 105603378 A | 5/2016 |
| CN | 205420526 U | 8/2016 |
| CN | 205501405 U | 8/2016 |

OTHER PUBLICATIONS

First Office Action, including Search Report, for Chinese Patent Application No. 201710232406.6, dated Sep. 26, 2018, 20 pages.

*Primary Examiner* — Tri T Ton
(74) *Attorney, Agent, or Firm* — Westman, Champlin & Koehler, P.A.

(57) ABSTRACT

The disclosure provides a mask assembly comprising a mask which comprises a first surface facing towards an evaporation source and a second surface facing towards an article to be deposited, and pattern openings are formed in the mask, wherein the mask assembly further comprises at least one test sheet which is detachably provided on the mask. The test sheet is provided at a region on the mask where no pattern opening is provided, and is configured such that an evaporation material can be deposited on the test sheet when an evaporation process is performed by using the mask assembly. The disclosure further provides an apparatus and a method for detecting a film thickness of the evaporation material on the mask assembly. With the apparatus, the film thickness of the evaporation material deposited on the mask assembly can be easily detected.

20 Claims, 4 Drawing Sheets

MASK ASSEMBLY, AND APPARATUS AND METHOD FOR DETECTING FILM THICKNESS OF EVAPORATION MATERIAL ON THE MASK

CROSS-REFERENCE TO RELATED APPLICATION

The present application claims priority to the Chinese Patent Application CN201710232406.6, filed on Apr. 11, 2017, the disclosure of which is hereby incorporated by reference in its entirety.

TECHNICAL FIELD

The present disclosure relates to the field of evaporation and sputtering, particularly, to a mask assembly, and an apparatus for detecting a film thickness of an evaporation material on a mask, and a method for detecting a film thickness of an evaporation material on a mask.

BACKGROUND

Generally, a patterned transparent conductive oxide layer is prepared by an evaporation process. A mask is used during the evaporation process.

SUMMARY

The present disclosure provides a mask assembly, an apparatus for detecting a film thickness of an evaporation material on a mask, and a method for detecting a film thickness of an evaporation material on a mask.

The present disclosure provides a mask assembly, comprising a mask, wherein, the mask comprises a first surface facing towards an evaporation source and a second surface facing towards an article to be deposited, at least one pattern opening is formed in the mask, the mask assembly further comprises at least one test sheet which is detachably provided on the mask, and the test sheet is provided on the mask at a region where no pattern opening is provided, and is configured such that an evaporation material can be deposited on the test sheet when an evaporation process is performed by using the mask assembly.

Optionally, the mask assembly further comprises a container comprising a receiving section on which a recess is formed, the at least one test sheet being provided in the recess; the mask comprises a holding tank being configured to receive the container, the holding tank is provided with an entrance formed at a side of the mask, a test via communicating with the holding tank is formed on the first surface, an area of the test via is smaller than that of the at least one test sheet, and an opening of the recess faces towards the test via.

Optionally, the container further comprises a mounting section provided with a screwed hole, and a connection hole is provided on the mask at a position which corresponds to the screwed hole in a case that the container is received in the holding tank; and the mask assembly further comprises a connection bolt which is provided in the screwed hole and the connection hole so as to detachably connect the container and the mask.

Optionally, the mask comprises a mask frame and a patterned plate fixed on the mask frame, the at least one pattern opening is formed on the patterned plate, the mask frame is provided to surround the patterned plate, and the holding tank is provided on the mask frame.

Optionally, the mask assembly comprises a plurality of the test sheets which are provided on the mask at different positions, respectively.

Optionally, the test sheet is made of a transparent material.

The present disclosure further provides an apparatus for detecting a film thickness of an evaporation material on a mask in the mask assembly, wherein the mask assembly is the above mask assembly provided by the present disclosure; the apparatus further comprises a film-thickness detector and a controller; the film-thickness detector is configured to detect a film thickness of an evaporation material deposited on the test sheet and to generate a signal corresponding to the film thickness of the evaporation material deposited on the test sheet; and an input terminal of the controller is electrically connected with an output terminal of the film-thickness detector, the film-thickness detector is configured to send the signal to the controller, and the controller determines the film thickness of the evaporation material deposited on the mask in accordance with the signal corresponding to the film thickness of the evaporation material deposited on the test sheet.

Optionally, the controller is configured to judge whether the film thickness of the evaporation material deposited on the mask exceeds a predetermined thickness.

Optionally, the test sheet is made of a transparent material; the film-thickness detector is configured to detect a light transmittance of the test sheet, and generates the signal corresponding to the film thickness of the evaporation material deposited on the test sheet in accordance with the light transmittance of the test sheet.

Optionally, the apparatus further comprises an alarm, and the controller controls the alarm to issue an alarming signal when the controller determines that the film thickness of the evaporation material on the mask exceeds the predetermined thickness.

The present disclosure further provides a method for detecting a film thickness of an evaporation material on a mask in the above mask assembly provided by the present disclosure, comprising:

detaching the test sheet from the mask assembly;

detecting a film thickness of an evaporation material deposited on the test sheet; and determining the film thickness of the evaporation material on the mask in accordance with the thickness of the film on the test sheet.

Optionally, the method further comprises:

comparing the film thickness of the evaporation material on the mask with a predetermined thickness; and issuing an alarming signal when the film thickness of the evaporation material on the mask exceeds the predetermined thickness.

Optionally, the test sheet is made of a transparent material, and the step of detecting the thickness of the film deposited on the test sheet comprises:

detecting a light transmittance of the test sheet; and determining the film thickness of the evaporation material deposited on the test sheet in accordance with the light transmittance of the test sheet.

BRIEF DESCRIPTION OF THE DRAWINGS

Drawings, which constitute a part of the description, are provided to explain the present disclosure in conjunction with the following specific implementations so as to provide a further understanding, instead of a limitation, of the present disclosure. In the drawings.

DETAILED DESCRIPTION

Specific implementations of the present disclosure will be described in detail below in conjunction with the accompanying drawings. It should be understood that, the specific implementations as described herein are provided for illustrating and explaining the present disclosure, but not for limiting.

Figure 1:
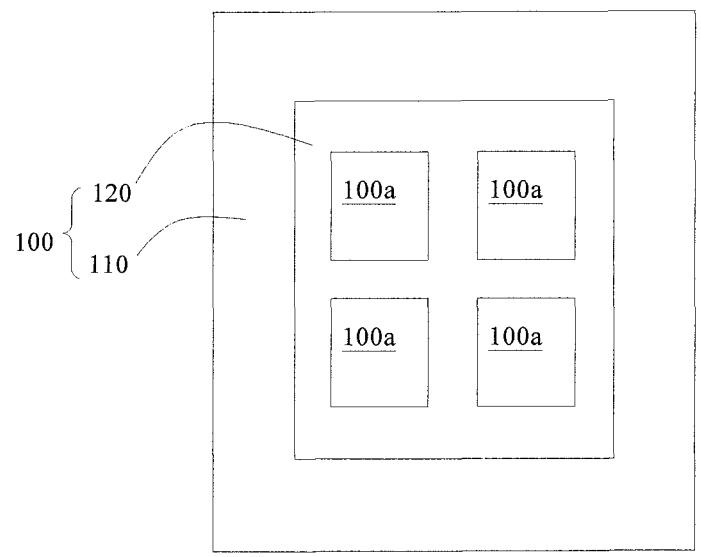
FIG. 1 is a schematic view of a mask in the prior art.

As shown in FIG. 1, a mask 100 generally includes a mask frame 110 and a patterned plate 120. Pattern openings 100a are formed in the patterned plate 120. A desired pattern may be formed on a base substrate by the pattern openings 100a provided in the mask 100. During an evaporation process, an evaporation source is provided at one side of the mask 100, and a base substrate to be deposited is provided at the other side of the mask 100.

A material from the evaporation source is deposited onto the base substrate through the pattern openings 100a. Meanwhile, a part of the material which does not pass through the pattern openings 100a may be deposited onto other region of the mask. With the increase of the usage time, a thickness of the material deposited on the other region on the mask is increased. The deposited material with a certain thickness may peel off the mask, causing contamination in the process chamber.

Thus, a technical problem having to be solved urgently is how to avoid the contamination in the process chamber due to the fact that the deposited material is peeling off the mask.

Figure 2:
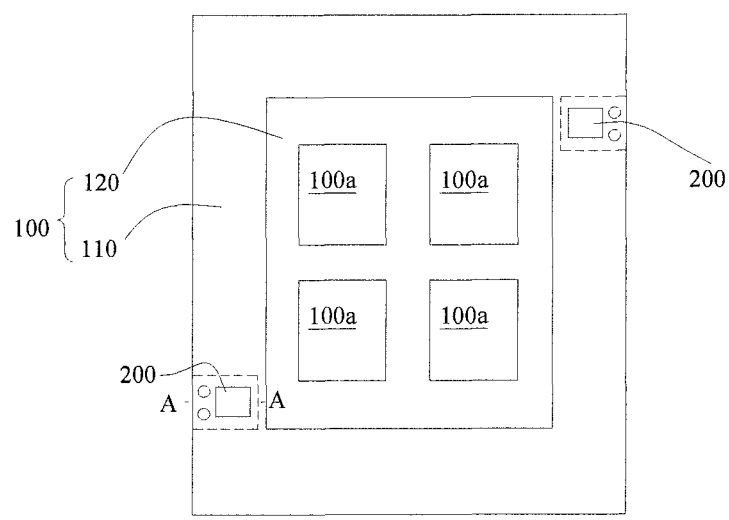
FIG. 2 is a schematic view of a mask assembly provided by the present disclosure.

In a first aspect of the present disclosure, a mask assembly is provided. As shown in FIG. 2, the mask assembly includes a mask 100 which includes a first surface facing towards the evaporation source and a second surface facing towards an article to be deposited. In the mask 100, the pattern openings 100a are formed. The mask assembly further includes at least one test sheet 200 detachably provided on the mask 100. The test sheet 200 is provided at a region on the mask 100 where no patter opening 100a is provided. The test sheet 200 is provided such that a part of its surface is exposed to the evaporation source when the mask assembly is used for the evaporation process thereby the evaporation material from the evaporation source can be deposited onto the test sheet.

As described above, when the mask assembly is used for the evaporation process, the evaporation material is deposited onto the test sheet 200. After the evaporation process is performed for predetermined times, the test sheet is detached from the mask 100, and a film thickness of the evaporation material deposited on the test sheet 200 is detected. Therefore, the detected film thickness of the evaporation material on the test sheet 200 can directly or indirectly reflect a film thickness of the evaporation material in other region on the mask.

The mask 100 may further include a mask frame 110 for fixing the patterned plate 120, and the pattern openings 100a are formed in the patterned plate 120. In this case, the test sheet 200 may be provided on the mask frame 110, as shown in FIG. 2.

Compared with the existing mask as shown in FIG. 1, the mask assembly of the present disclosure is provided with the test sheet at a region on the mask where no pattern opening is provided, such that the film thickness of the evaporation material deposited on the other region on the mask can be detected.

For example, when the test sheet is provided directly on the first surface of the mask, the film thickness of the evaporation material on the test sheet 200 is equivalent to that of the evaporation material deposited on the mask. For example, when the test sheet is fixed onto the mask by using certain component or element (e.g., the test sheet is fixed onto the mask by a screen mesh with holes), the film thickness of the evaporation material deposited on the test sheet will be smaller than the film thickness of the evaporation material deposited on the mask. It should be understood that, a person skilled in the art may determine the relationship between the film thickness of the evaporation material deposited on the test sheet and the film thickness of the evaporation material deposited on the mask. In accordance with such relationship, the film thickness of the evaporation material on the mask may be obtained by detecting the film thickness of the evaporation material on the test sheet.

Since the test sheet is detachably provided on the mask assembly, it is easy to detect the test sheet 200 and obtain the film thickness of the evaporation material deposited on the mask 100. When the film thickness of the evaporation material deposited on the mask 100 reaches a predetermined thickness, it is required to clean the mask 100 so as to prevent the process chamber from being contaminated by the evaporation material peeling off the mask due to its large thickness.

Accordingly, a product yield can be improved when the evaporation process is performed by using the mask and the mask assembly including the test sheet provided by the present disclosure.

A shape of the pattern opening 100a is determined by a pattern to be formed on the base substrate. For example, if a pixel electrode is to be formed, the shape of the pattern opening 100a should correspond to the shape of the pixel electrode to be formed.

In the present disclosure, how to arrange the test sheet 200 on the mask assembly is not limited, so long as the evaporation material can be deposited on the test sheet 200 during the evaporation process and the thickness of the evaporation material deposited on the test sheet 200 can reflect the thickness of the evaporation material deposited on the mask at other region. For example, the test sheet 200 may be directly fixed to the mask 100 on the first surface by using a bolt or a screw.

Figure 3:
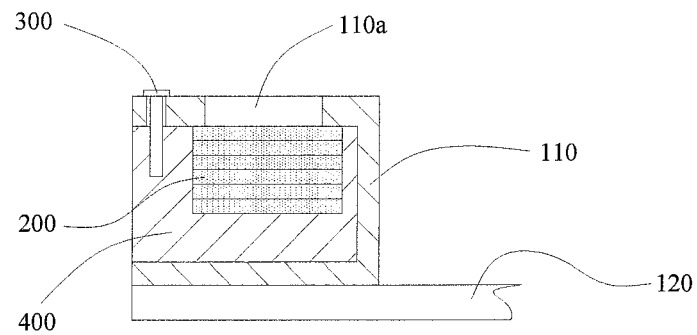
FIG. 3 is a local sectional view of the mask assembly taken along an A-A line as shown in FIG. 2.
Figure 4:
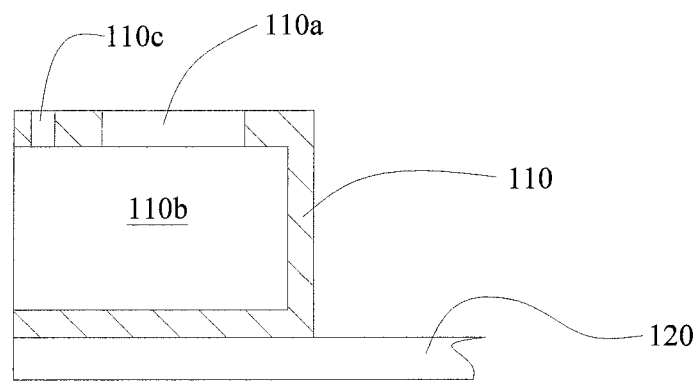
FIG. 4 is a local sectional view of the mask taken along the A-A line as shown in FIG. 2.
Figure 5:
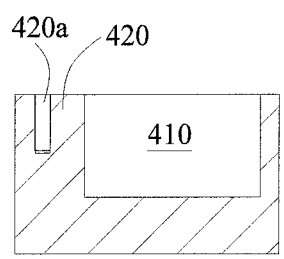
FIG. 5 is a schematic view of a container.

In order to prevent the test sheet 200 from peeling off the mask and being broken during the deposition process, optionally, as shown in FIG. 3, the mask assembly may include a container. As shown in FIGS. 3 and 5, the container 400 includes a receiving section on which a recess 410 is formed. As shown in FIG. 3, the test sheet 200 is provided in the recess. It should be noted that, one or more test sheets 200 may be placed in one recess. Accordingly, as shown in FIGS. 3 and 4, the mask 100 may include a holding tank 110b, and an entrance of the holding tank 110b is formed at a side of the mask. As shown in FIG. 4, a test via 110a communicating with the holding tank 110b is formed on the first surface. An area of the test via 110a is smaller than that of the test sheet 200 so as to prevent the test sheet from falling out of the test via 110a. Also, as shown in FIG. 3, an opening of the recess faces towards the test via 110a so that the evaporation material can be deposited onto the test sheet 200 through the test via 110a.

As shown in FIG. 5, the container 400 further includes a second mounting component 420 for fixing the container 400 to the mask. If it is desired to detect the film thickness of the evaporation material deposited on the test sheet 200 received in the container 400, a connection between the second mounting component 420 and the mask 100 is released, the container 400 is taken out of the holding tank 110b, and then the test sheet on the top is taken out so as to detect the film thickness of the evaporation material deposited thereon. In this case, the test sheet 200 is detached by detaching the container 400, and such manner will not damage the test sheet 200. Moreover, when the test sheet 200 is taken out, its surface will not be rubbed, and thereby the film thickness of the evaporation material deposited on the test sheet 200 can reflect the film thickness of the evaporation material deposited on the mask at other region precisely.

In the present disclosure, how to detachably fix the container to the mask is not limited. As shown in FIGS. 3 and 5, the container 400 further includes the second mounting component 420 which is detachably connected with the mask 100.

As shown in FIG. 5, a screwed hole 420a is provided in the second mounting component 420. As shown in FIG. 4, a connection hole 110c is provided on the mask 100 at a position corresponding to the screwed hole 420a. The first mounting component of the mask may further include a connection bolt 300 which is to be provided in the screwed hole and the connection hole so as to detachably connect the container 400 and the mask 100.

In the present disclosure, the specific structure of the mask 100 is not limited. As shown in FIGS. 2 and 3, the mask 100 includes the mask frame 110 and the patterned plate 120 fixed on the mask frame 110. The pattern openings 100a are formed in the patterned plate 120, and the mask frame 110 is provided to surround the patterned plate 120. As shown in FIG. 4, the holding tank 110b is formed in the mask frame 110.

In order to more precisely determine whether it is necessary to clean the mask, optionally, the mask assembly may include a plurality of test sheets 200 which are provided on the mask 100 at different positions where no pattern via is provided, respectively. If a film thickness of an evaporation material deposited on a test sheet 200 at any one of the positions exceeds a predetermined thickness, it is necessary to clean the mask. FIG. 2 shows an example in which two test sheets 200 are provided at opposite corners of the mask, respectively. Obviously, the present disclosure is not limited thereto.

In the present disclosure, a material of the test sheet is not limited. Moreover, how to measure the film thickness of the evaporation material deposited on the test sheet is not limited. For example, the test sheet may be of a metal material. In this case, the film thickness of the evaporation material on the test sheet may be determined by scanning the test sheet along the thickness direction of the test sheet.

Optionally, the test sheet 200 may be made of a transparent material (for example, glass). Accordingly, the film thickness of the evaporation material deposited on the test sheet may be determined by detecting light transmittance of the test sheet 200. The method of testing the light transmittance is easily realized, and is a nondestructive testing method, thereby the test sheet 200 can be utilized repeatedly.

For easy understanding, how to measure the film thickness of IZO (indium zinc oxide glass) deposited on the test sheet 200 in the evaporation process of IZO will be described below.

Figure 6:
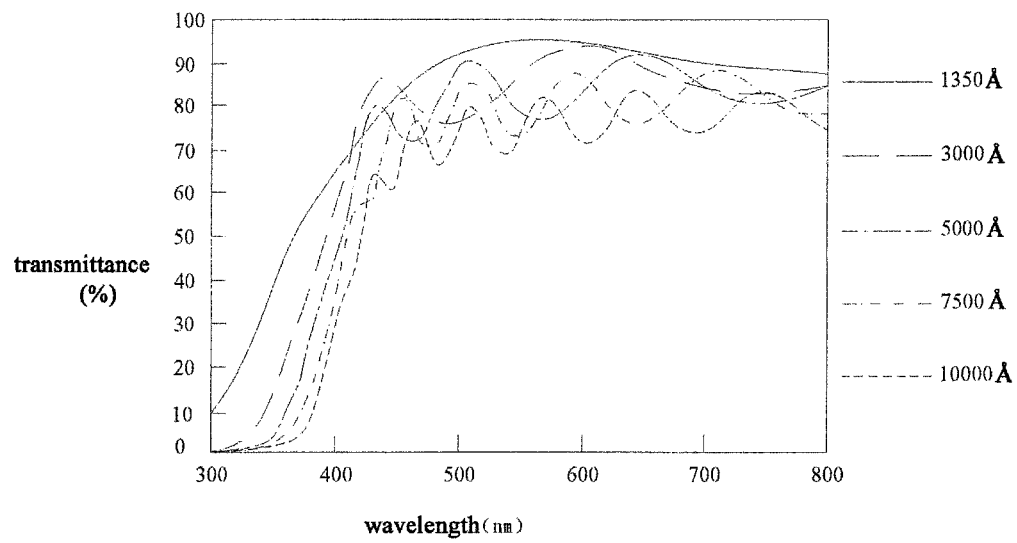
FIG. 6 illustrates transmittance curves of IZO films of different thicknesses being irradiated by light with different wavelengths.

FIG. 6 shows a light transmittance curve of an IZO film having a thickness of 1350 angstrom (Å) when it is irradiated by light with different wavelengths, a light transmittance curve of an IZO film having a thickness of 3000 Å when it is irradiated by light with different wavelengths, a light transmittance curve of an IZO film having a thickness of 5000 Å when it is irradiated by light with different wavelengths, a light transmittance curve of an IZO film having a thickness of 7500 Å when it is irradiated by light with different wavelengths, and a light transmittance curve of an IZO film having a thickness of 10000 Å when it is irradiated by light with different wavelengths.

Figure 7:
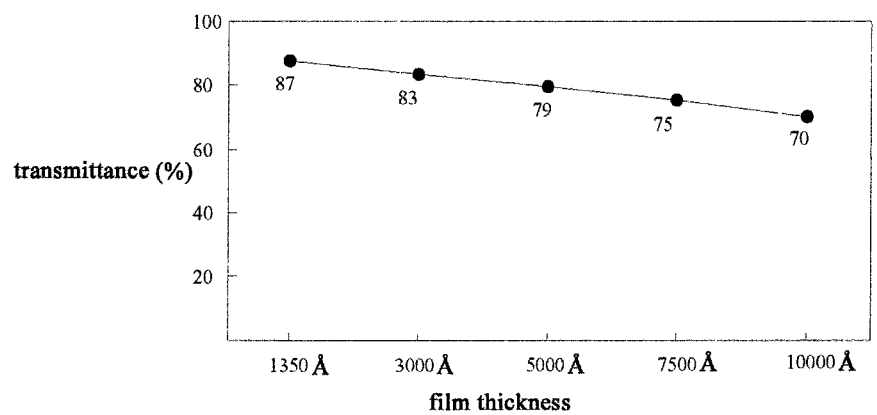
FIG. 7 illustrates an average transmittance curve of IZO films of different thicknesses.
Figure 8:
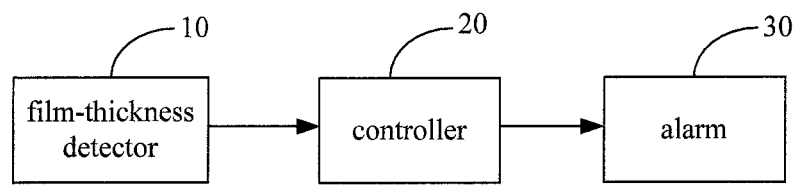
FIG. 8 shows a block diagram of an apparatus for testing a film thickness of an evaporation material on the mask.
Figure 9:
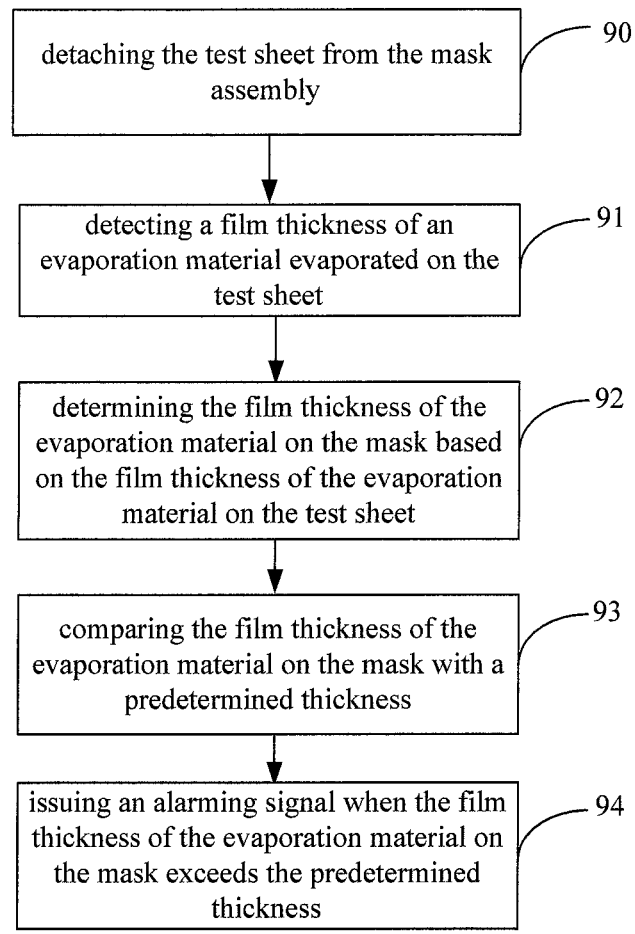
FIG. 9 is a flow chart illustrating a method for testing a film thickness of an evaporation material on the mask.
Figure 10:
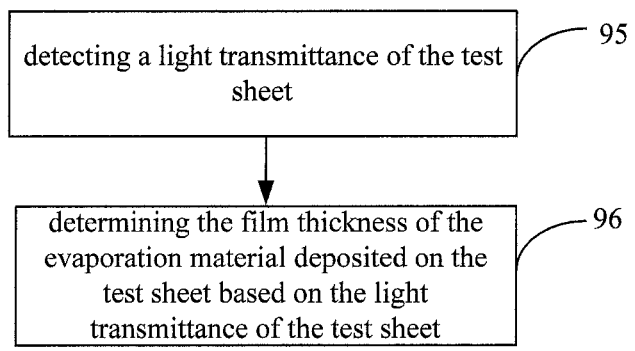
FIG. 10 is a flow chart illustrating a method for testing a film thickness of an evaporation material on a testing sheet during testing.

FIG. 7 shows that an average light transmittance of the IZO film having the thickness of 1350 Å with respect to light with different wavelengths is 87%, an average light transmittance of the IZO film having the thickness of 3000 Å with respect to light with different wavelengths is 83%, an average light transmittance of the IZO film having the thickness of 5000 Å with respect to light with different wavelengths is 79%, an average light transmittance of the IZO film having the thickness of 7500 Å with respect to light with different wavelengths is 75%, and an average transmittance of the IZO film having the thickness of 10000 Å with respect to light with different wavelengths is 70%.

From FIG. 7, it can be seen that the light transmittance is decreased as the film thickness is increased.

Thus, when the average light transmittance of the test sheet 200 is obtained, the thickness of the IZO film on the test sheet 200 may be obtained in accordance with the curve in FIG. 7.

In a second aspect of the present disclosure, an apparatus for detecting the film thickness of the evaporation material on the mask in the above mask assembly in the present disclosure is provided. The apparatus includes a film-thickness detector 10 and a controller 20. The film-thickness detector 10 is used for detecting the film thickness of the evaporation material deposited on the test sheet, and generating a signal corresponding to the film thickness of the evaporation material deposited on the test sheet. An input terminal of the controller 20 is electrically connected to an output terminal of the film-thickness detector 10. The film-thickness detector 10 can send the signal to the controller 20, and the controller 20 can determine the film thickness of the evaporation material deposited on the mask in accordance with the signal corresponding to the film thickness of the evaporation material deposited on the test sheet.

With this apparatus, it is easy to detect the film thickness of the evaporation material deposited on the mask, and thereby the contamination in the process chamber due to the fact that the evaporation material deposited on the mask peels off the mask can be avoided effectively.

The signal corresponding to the film thickness of the evaporation material deposited on the test sheet can be generated by the film-thickness detector 10. The film thickness of the evaporation material deposited on the mask can be obtained by the controller 20.

As described above, since the test sheet and the mask are provided in the same mask assembly, the relationship between the film thickness of the evaporation material deposited on the test sheet and that of the evaporation material deposited on the mask may be determined. For example, as an implementation, the film thickness of the evaporation material deposited on the test sheet is equal to that of the evaporation material deposited on the mask. Thus, the film thickness of the evaporation material deposited on the mask can be easily determined in accordance with the film thickness of the evaporation material deposited on the test sheet.

The apparatus may further include a display which is electrically connected to the controller. As an implementation, the thickness of the film deposited on the mask that is determined by the controller may be directly displayed by the display, and an operator can subjectively judge whether it is necessary to clean the mask. Optionally, the controller may judge whether the film thickness of the evaporation material deposited on the mask exceeds a predetermined thickness, which can improve the accuracy of the judgment, and the operator may be reminded to clean the mask in time.

In the present disclosure, the predetermined thickness is not limited. A person skilled in the art may select the predetermined thickness based on a specific evaporation material. For example, when evaporating IZO, a risk of peeling off may occur when the thickness of the IZO film deposited on the mask exceeds 5000 Å. Therefore, when evaporating IZO, the predetermined thickness may be set to be 5000 Å.

As described above, the test sheet may be made of a transparent material. In this case, the film-thickness detector may detect the light transmittance of the test sheet, and generate a signal corresponding to the film thickness of the evaporation material deposited on the test sheet in accordance with the light transmittance of the test sheet.

For easily reminding the operator, optionally, the apparatus further includes an alarm 30. The controller 20 controls the alarm to issue an alarming signal when judging that the thickness of the film on the mask exceeds the predetermined thickness. In the present disclosure, a type of the alarming signal is not limited. For example, the alarming signal may be an optical signal or an acoustical signal.

In a third aspect of the present disclosure, a method for detecting the film thickness of the evaporation material on the mask in the above mask assembly of the present disclosure is provided. The method includes:

Step 90: detaching the test sheet from the mask assembly;

Step 91: detecting a film thickness of an evaporation material deposited on the test sheet; and Step 92: determining the film thickness of the evaporation material on the mask in accordance with the film thickness of the evaporation material on the test sheet.

Since a dimension of the test sheet may be small, it is easy to measure the film thickness of the evaporation material thereon.

For easily reminding the operator, optionally, the method further comprises:

Step 93: comparing the film thickness of the evaporation material on the mask with a predetermined thickness; and Step 94: issuing an alarming signal when the film thickness of the evaporation material on the mask exceeds the predetermined thickness.

In a case that the test sheet is made of a transparent material, the step of detecting the film thickness of the evaporation material deposited on the test sheet comprises:

Step 95: detecting a light transmittance of the test sheet; and

Step 96: determining the film thickness of the evaporation material deposited on the test sheet in accordance with the light transmittance of the test sheet.

It is a nondestructive detection method that the film thickness of the evaporation material deposited on the test sheet is determined by detecting the light transmittance of the test sheet, which facilitates reutilization of the test sheet. Moreover, such a testing method is simple, does not require preparing of a test sample, and is easy to accomplish.

It will be appreciated that the above embodiments are exemplary implementations for the purpose of illustrating the present disclosure only, and the present disclosure is not limited thereto. It will be apparent to a person skilled in the art that many variations and modifications may be made without departing from the present disclosure. These variations and modifications should also be considered as the protective scope of the present disclosure.

What is claimed is:

1. A mask assembly, comprising a mask, wherein,
the mask comprises a first surface facing towards an evaporation source and a second surface facing towards an article to be deposited,
at least one pattern opening is formed in the mask,
the mask assembly further comprises at least one test sheet which is detachably provided on the mask, and
the test sheet is provided on the mask at a region where no pattern opening is provided, and is configured such that an evaporation material can be deposited on the test sheet when an evaporation process is performed by using the mask assembly.

2. The mask assembly of claim 1, further comprising a container comprising a receiving section on which a recess is formed, the at least one test sheet being provided in the recess;
wherein, the mask comprises a holding tank being configured to receive the container, the holding tank is provided with an entrance formed at a side of the mask, a test via communicating with the holding tank is formed on the first surface, an area of the test via is smaller than that of the at least one test sheet, and an opening of the recess faces towards the test via.

3. The mask assembly of claim 2, wherein the container further comprises a mounting section provides with a screwed hole, and a connection hole is provided on the mask at a position which corresponds to the screwed hole in a case that the container is received in the holding tank; and
the mask assembly further comprises a connection bolt which is provided in the screwed hole and the connection hole so as to detachably connect the container and the mask.

4. The mask assembly of claim 2, wherein the mask comprises a mask frame and a patterned plate fixed on the mask frame, the at least one pattern opening is formed on the patterned plate, the mask frame is provided to surround the patterned plate, and the holding tank is provided on the mask frame.

5. The mask assembly of claim 1, wherein the mask assembly comprises a plurality of the test sheets which are provided on the mask at different positions, respectively.

6. The mask assembly of claim 1, wherein the test sheet is made of a transparent material.

7. An apparatus for detecting a film thickness of an evaporation material on a mask in the mask assembly of claim 1, the apparatus comprising a film-thickness detector and a controller, wherein the film-thickness detector is configured to detect a film thickness of an evaporation material deposited on the test sheet and to generate a signal corresponding to the film thickness of the evaporation material deposited on the test sheet; and an input terminal of the controller is electrically connected with an output terminal of the film-thickness detector, the film-thickness detector is configured to send the signal to the controller, and the controller determines the film thickness of the evaporation material deposited on the mask in accordance with the signal corresponding to the film thickness of the evaporation material deposited on the test sheet.

8. The apparatus of claim 7, wherein the controller is configured to judge whether the film thickness of the evaporation material deposited on the mask exceeds a predetermined thickness.

9. The apparatus of claim 8, wherein the test sheet is made of a transparent material;

the film-thickness detector detects a light transmittance of the test sheet, and generates the signal corresponding to the film thickness of the evaporation material deposited on the test sheet in accordance with the light transmittance of the test sheet.

10. The apparatus of claim 7, further comprising an alarm, wherein, the controller controls the alarm to issue an alarming signal when the controller determines that the film thickness of the evaporation material on the mask exceeds the predetermined thickness.

11. A method for detecting a film thickness of an evaporation material on a mask in the mask assembly of claim 1, comprising:

detaching the test sheet from the mask assembly;

detecting the film thickness of an evaporation material deposited on the test sheet; and determining the film thickness of the evaporation material on the mask in accordance with the film thickness of the evaporation material on the test sheet.

12. The method of claim 11, further comprising:

comparing the film thickness of the evaporation material on the mask with a predetermined thickness; and issuing an alarming signal when the film thickness of the evaporation material on the mask exceeds the predetermined thickness.

13. The method of claim 11, wherein the test sheet is made of a transparent material, and the step of detecting the film thickness of the evaporation material deposited on the test sheet comprises:

detecting a light transmittance of the test sheet; and determining the film thickness of the evaporation material deposited on the test sheet in accordance with the light transmittance of the test sheet.

14. The method of claim 12, wherein the test sheet is made of a transparent material, and the step of detecting the film thickness of the evaporation material deposited on the test sheet comprises:

detecting a light transmittance of the test sheet; and determining the film thickness of the evaporation material deposited on the test sheet in accordance with the light transmittance of the test sheet.

15. The mask assembly of claim 2, wherein the mask assembly comprises a plurality of the test sheets which are provided on the mask at different positions, respectively.

16. The mask assembly of claim 3, wherein the mask assembly comprises a plurality of the test sheets which are provided on the mask at different positions, respectively.

17. The mask assembly of claim 4, wherein the mask assembly comprises a plurality of the test sheets which are provided on the mask at different positions, respectively.

18. The mask assembly of claim 2, wherein the test sheet is made of a transparent material.

19. The mask assembly of claim 3, wherein the test sheet is made of a transparent material.

20. The mask assembly of claim 4, wherein the test sheet is made of a transparent material.

* * * * *